(12) United States Patent
Cai et al.

(10) Patent No.: US 11,380,703 B2
(45) Date of Patent: Jul. 5, 2022

(54) MEMORY STRUCTURES AND METHODS OF FORMING MEMORY STRUCTURES

(71) Applicant: GLOBALFOUNDRIES Singapore Pte. Ltd., Singapore (SG)

(72) Inventors: Xinshu Cai, Singapore (SG); Yongshun Sun, Singapore (SG); Lanxiang Wang, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 0 days.

(21) Appl. No.: 17/087,683

(22) Filed: Nov. 3, 2020

(65) Prior Publication Data

US 2022/0139929 A1 May 5, 2022

(51) Int. Cl.
*H01L 27/1156* (2017.01)
*H01L 29/06* (2006.01)

(52) U.S. Cl.
CPC ...... *H01L 27/1156* (2013.01); *H01L 29/0649* (2013.01)

(58) Field of Classification Search
None
See application file for complete search history.

(56) References Cited

U.S. PATENT DOCUMENTS

| 5,793,088 A * | 8/1998 | Choi | H01L 21/266 257/335 |
| 7,099,192 B2 | 8/2006 | Wang et al. | |
| 2014/0177312 A1* | 6/2014 | Shibata | G11C 11/417 365/72 |

OTHER PUBLICATIONS

Li et al., "Novel Logic Non-Volatile Memory with Highly Reliable Performances for Autotronic Application", 2019 IEEE 11th International Memory Workshop (IMW), 2019, 4 pages, IEEE.

* cited by examiner

*Primary Examiner* — Anthony Ho
*Assistant Examiner* — Kevin Quinto
(74) *Attorney, Agent, or Firm* — Viering Jentschura & Partner MBB

(57) ABSTRACT

A memory structure may be provided, including a substrate, and a first well region, a second well region, and a third well region arranged within the substrate, where the first well region and the third well region may have a first conductivity type, and the second well region may have a second conductivity type different from the first conductivity type, and where the second well region may be arranged laterally between the first well region and the third well region. The memory structure may further include a first gate structure and a second gate structure arranged over the second well region. The first gate structure may extend over the third well region and the second gate structure may extend over the first well region.

16 Claims, 5 Drawing Sheets

MEMORY STRUCTURES AND METHODS OF FORMING MEMORY STRUCTURES

TECHNICAL FIELD

The present disclosure relates generally to memory structures, and methods of forming the memory structures.

BACKGROUND

Non-volatile memory devices are often used in various consumer electronic products such as smart phones and tablets. A type of non-volatile memory device may be the 2-transistors-1-capacitor (2T1C) memory device that typically includes a floating gate, a select transistor, and a coupling capacitor. Such a memory device is a one-bit memory device and is usually large in size. To form a two-bit memory device, two of such memory devices may be coupled together but the resulting memory device may be even larger in size.

Therefore, it is desirable to provide an improved two-bit memory device with a smaller size.

SUMMARY

According to various non-limiting embodiments, there may be provided a memory structure including: a substrate; a first well region, a second well region, and a third well region arranged within the substrate, where the first well region and the third well region may have a first conductivity type, and the second well region may have a second conductivity type different from the first conductivity type, and where the second well region may be arranged laterally between the first well region and the third well region; a first gate structure arranged over the second well region, where the first gate structure may extend over the third well region; and a second gate structure arranged over the second well region, where the second gate structure may extend over the first well region.

According to various non-limiting embodiments, there may be provided a method of forming a memory structure, the method including: providing a substrate; forming a first well region, a second well region and a third well region within the substrate, where the first well region and the third well region may have a first conductivity type, and the second well region may have a second conductivity type different from the first conductivity type, and where the second well region may be arranged laterally between the first well region and the third well region; forming a first gate structure over the second well region, where the first gate structure may extend over the third well region; and forming a second gate structure over the second well region, where the second gate structure may extend over the first well region.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

Figure 1A:
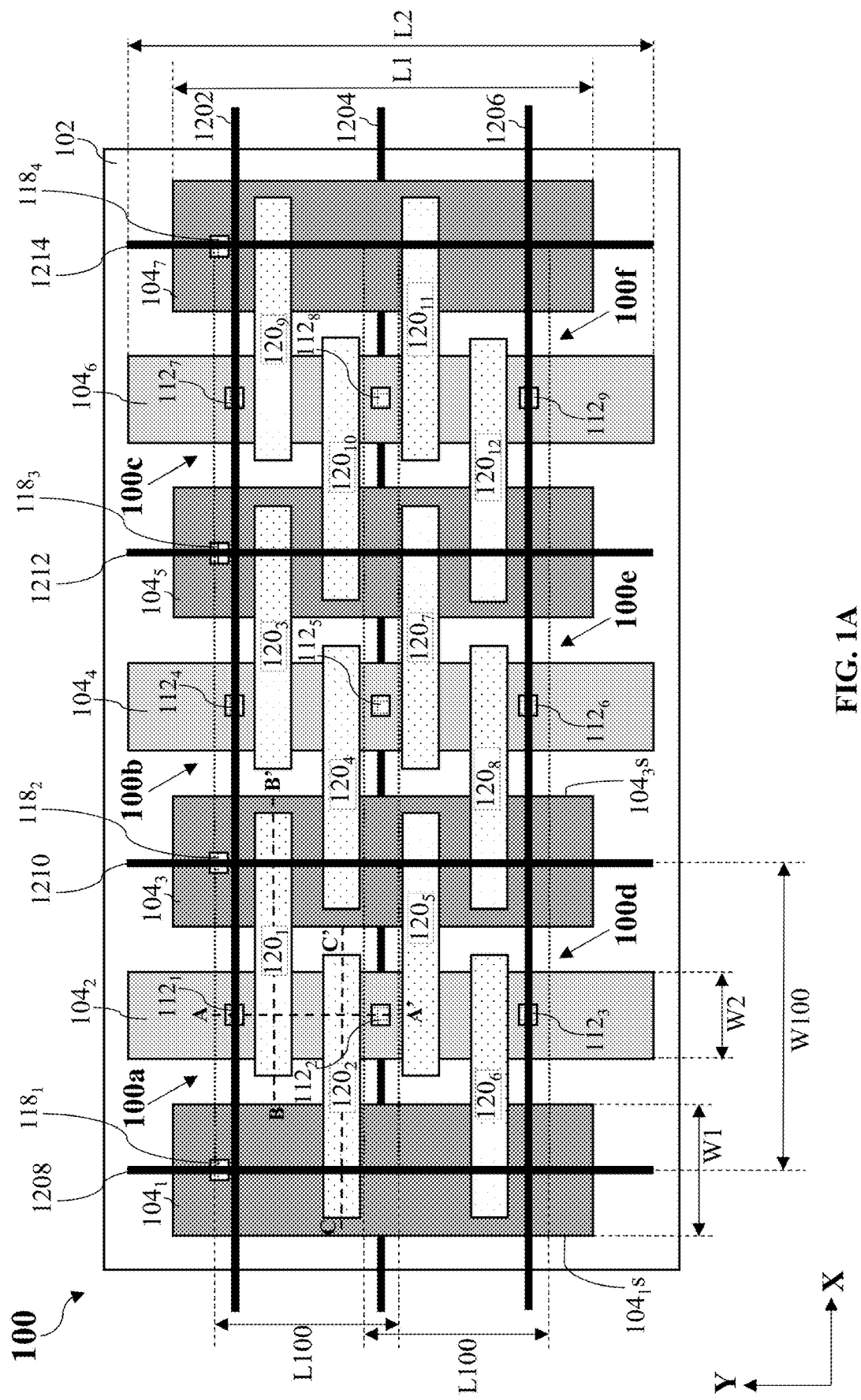
FIG. 1A shows a simplified top view of a memory structure according to various non-limiting embodiments, and FIGS. 1B, 1C and 1D respectively shows a first simplified cross-sectional view, a second simplified cross-sectional view and a third simplified cross-sectional view of the memory structure of FIG. 1A.

The embodiments generally relate to memory structures. More particularly, some embodiments relate to non-volatile memory structures. The non-volatile memory structures may be used in various consumer electronic products such as smart phones and tablets, and micro control units (MCU).

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
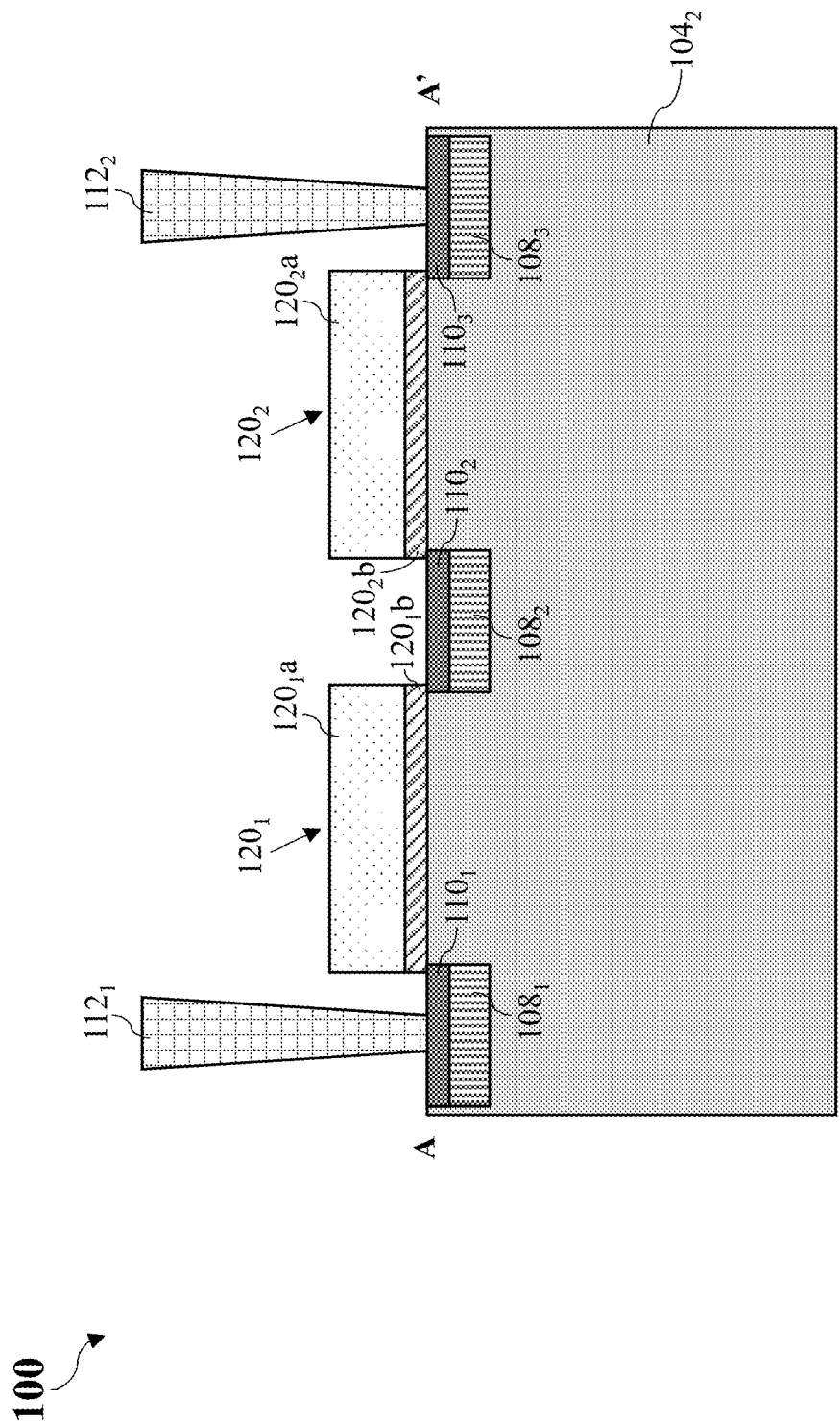
Figure 1C:
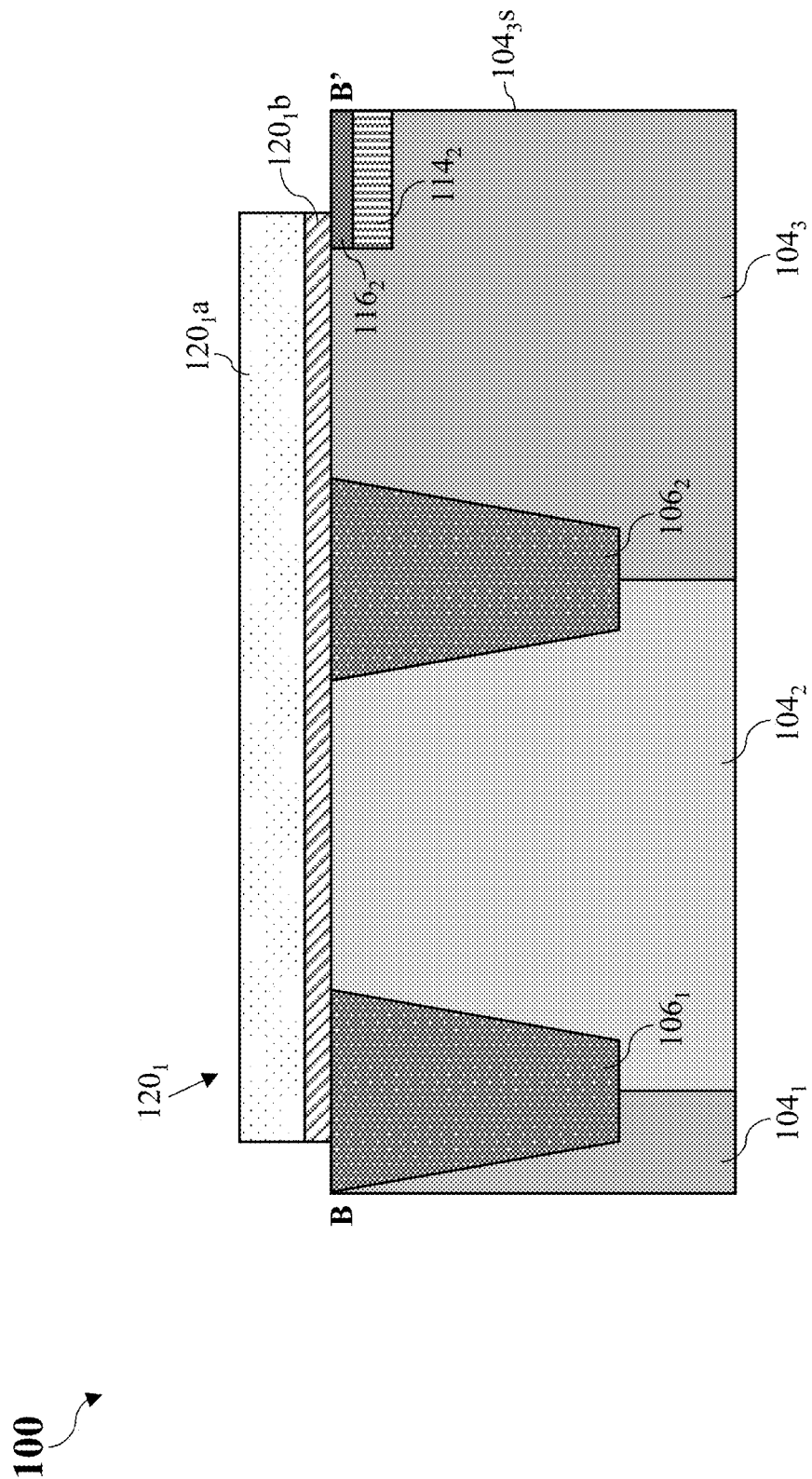
Figure 1D:
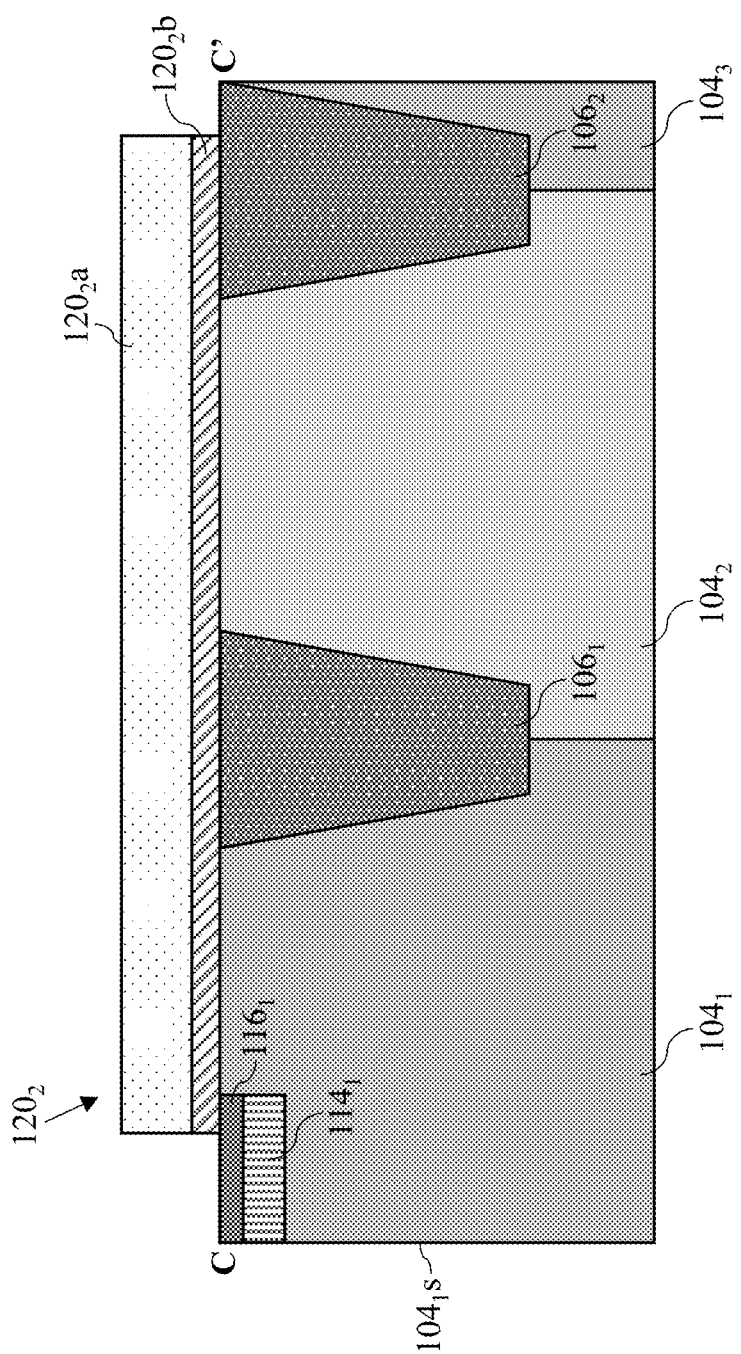

FIG. 1A shows a simplified top view of a memory structure 100 according to various non-limiting embodiments. FIGS. 1B, 1C and 1D show simplified cross-sectional views of the memory structure 100 along the line A-A', the line B-B' and the line C-C', respectively. The memory structure 100 may be a non-volatile memory structure, such as, a multi-time programmable (MTP) non-volatile memory structure.

Referring to FIG. 1A, the memory structure 100 may include a substrate 102. The substrate 102 may be a semiconductor substrate. For example, the substrate 102 may include semiconductor material, such as but not limited to, silicon (Si), germanium (Ge), silicon carbide (SiC) or combinations thereof.

The memory structure 100 may further include a plurality of well regions including first, second, third, fourth, fifth, sixth and seventh well regions $104_1$-$104_7$ arranged within the substrate 102. The first to seventh well regions $104_1$-$104_7$ may be arranged laterally adjacent to one another in the aforementioned order in a first direction X. As shown in FIG. 1A, a length L1 of a first set of well regions $104_1$, $104_3$, $104_5$, $104_7$ may be approximately equal and a length L2 of a second set of well regions $104_2$, $104_4$, $104_6$ may be approximately equal, where L2 may be greater than L1. A width W1 of the first set of well regions $104_1$, $104_3$, $104_5$, $104_7$ may be approximately equal and a width W2 of the second set of well regions $104_2$, $104_4$, $104_6$ may be approximately equal, where W1 may be greater than W2.

Each well region $104_1$-$104_7$ may include one or more dopants. The first set of well regions $104_1$, $104_3$, $104_5$, $104_7$ may have a first conductivity type (in other words, may include dopants having the first conductivity type); whereas, the second set of well regions $104_2$, $104_4$, $104_6$ may have a second conductivity type (in other words, may include dopants having the second conductivity type). The second conductivity type may be different from the first conductivity type. In other words, each well region of the second set of well regions $104_2$, $104_4$, $104_6$ having the second conductivity type may be arranged laterally between two well regions of the first set of well regions $104_1$, $104_3$, $104_5$, $104_7$ having the first conductivity type. For example, the second well region $104_2$ may be arranged laterally between the first well region $104_1$ and the third well region $104_3$; the fourth well region $104_4$ may be arranged laterally between the third well region $104_3$ and the fifth well region $104_5$, and the sixth well region $104_6$ may be arranged laterally between the fifth well region $104_5$ and the seventh well region $104_7$. In an exemplary non-limiting embodiment, the first conductivity type may be N-type and the second conductivity type may be P-type. However, the first conductivity type may alternatively be P-type and the second conductivity type may alternatively be N-type. P-type dopants can for example, include, but are not limited to boron (B), indium (In), or a combination thereof, while N-type dopants can for example, include, but are not limited to, phosphorus (P), arsenic (As), antimony (Sb), or a combination thereof. A doping concentration of each of the well regions $104_1$-$104_7$ may be approximately equal and may range from about $1\times10^{15}/cm^3$ to about $1\times10^{17}/cm^3$.

The memory structure 100 may further include a plurality of isolation elements, where each isolation element may be arranged between two adjacent well regions $104_1$-$104_7$. For example, referring to FIGS. 1C and 1D, a first isolation element $106_1$ may be arranged between the first well region $104_1$ and the second well region $104_2$; whereas, a second isolation element $106_2$ may be arranged between the second well region $104_2$ and the third well region $104_3$. Each isolation element (e.g. $106_1$, $106_2$) may include isolation/electrically insulating material such as, but not limited to, dielectric material for example, silicon oxide. In a non-limiting embodiment, each isolation element (e.g. $106_1$, $106_2$) may be a shallow trench isolation element. Note that for clarity of illustration, the isolation elements are not shown in FIG. 1A.

As shown in FIG. 1B, the memory structure 100 may also include a plurality of conductive regions (including first, second and third conductive regions $108_1$, $108_2$, $108_3$) arranged within the second well region $104_2$. For example, the first, second and third conductive regions $108_1$, $108_2$, $108_3$ may be arranged laterally adjacent to one another in a second direction Y substantially perpendicular to the first direction X, where the second conductive region $108_2$ may be arranged between the first conductive region $108_1$ and the third conductive region $108_3$. The conductive regions $108_1$, $108_2$, $108_3$ may be spaced apart from one another. Accordingly, a portion of the second well region $104_2$ may be arranged between the first and second conductive regions $108_1$, $108_2$, and another portion of the second well region $104_2$ may be arranged between the second and third conductive regions $108_2$, $108_3$. These portions of the second well region $104_2$ may form channel regions. The conductive regions $108_1$, $108_2$, $108_3$ may include one or more dopants, and may have the first conductivity type. A doping concentration of each of the first, second and third conductive regions $108_1$, $108_2$, $108_3$ may be approximately equal and may be higher than a doping concentration of the second well region $104_2$. For example, the doping concentration of each of the first, second and third conductive regions $108_1$, $108_2$, $108_3$ may range from about $1\times10^{19}/cm^3$ to about $1\times10^{20}/cm^3$. As shown in FIG. 1B, a silicide layer $110_1$-$110_3$ may be arranged over each of the first, second and third conductive regions $108_1$-$108_3$ within the second well region $104_2$. Note that although FIG. 1B depicts each silicide layer $110_1$-$110_3$ as fully overlapping with the respective conductive region $108_1$-$108_3$, each silicide layer $110_1$-$110_3$ may alternatively overlap partially with the respective conductive region $108_1$-$108_3$. Each silicide layer $110_1$-$110_3$ may include silicide material, such as, but not limited to, cobalt silicide, nickel silicide, titanium silicide, tantalum silicide, or combinations thereof. Conductive regions similar to the first, second and third conductive regions $108_1$, $108_2$, $108_3$ may be arranged in a similar manner in each of the fourth and sixth well regions $104_4$, $104_6$, and a silicide layer may also be arranged over each of these conductive regions.

Referring to FIGS. 1A and 1B, the memory structure 100 may include a plurality of bit line connectors (first to ninth bit line connectors $112_1$-$112_9$) arranged over the second well region $104_2$, the fourth well region $104_4$ and the sixth well region $104_6$. The bit line connectors $112_1$-$112_9$ may each include an electrically conductive material, such as, but not limited to, aluminum, copper, tungsten, alloys thereof, or combinations thereof. Each bit line connector $112_1$-$112_9$ may be electrically coupled with a respective conductive region within the second, fourth and sixth well regions $104_2$, $104_4$, $104_6$. For example, as shown in FIG. 1B, the first bit line connector $112_1$ may be arranged over and may be electrically coupled with the first conductive region $108_1$ within the second well region $104_2$; whereas, the second bit line connector $112_2$ may be arranged over and may be electrically coupled with the third conductive region $108_3$ within the second well region $104_2$. The first and second bit line connectors $112_1$, $112_2$ may be configured to electrically couple the first and third conductive regions $108_1$, $108_3$ respectively to external voltages. On the other hand, the second conductive region $108_2$ may be a floating junction region that may not be electrically coupled to any external voltage. Accordingly, there may be an absence of a connector over the second conductive region $108_2$.

The memory structure 100 may include a first additional conductive region $114_1$ (FIG. 1D) arranged within the first well region $104_1$ and a second additional conductive region $114_2$ (FIG. 1C) arranged within the third well region $104_3$. For example, each additional conductive region $114_1$, $114_2$ may include at least a portion arranged along a side surface $104_1s$, $104_3s$ of the respective well region $104_1$, $104_3$, where these side surfaces $104_1s$, $104_3s$ may face away from the second well region $104_2$. The additional conductive regions $114_1$, $114_2$ may include one or more dopants and may have the first conductivity type. A doping concentration of each of the first and second additional conductive regions $114_1$, $114_2$ may be approximately equal and may be higher than doping concentrations of the first and third well regions $104_1$, $104_3$. For example, the doping concentration of each of the first and second additional conductive regions $114_1$, $114_2$ may range from about $1\times10^{19}$/cm$^3$ to about $1\times10^{20}$/cm$^3$. As shown in FIGS. 1C and 1D, a silicide layer $116_1$, $116_2$ may be arranged over each of the first and second additional conductive regions $114_1$, $114_2$ within the respective well region $104_1$, $104_3$. Similarly, although FIGS. 1C and 1D depict each silicide layer $116_1$, $116_2$ as fully overlapping with the respective additional conductive region $114_1$, $114_2$, each silicide layer $116_1$, $116_2$ may alternatively overlap partially with the respective additional conductive region $114_1$, $114_2$. Each silicide layer $116_1$, $116_2$ may include silicide material, such as, but not limited to, cobalt silicide, nickel silicide, titanium silicide, tantalum silicide, or combinations thereof. Similar additional conductive regions may be arranged in a similar manner within the fifth well region $104_5$ and the seventh well region $104_7$, and a silicide layer may also be arranged over each of these additional conductive regions.

Referring to FIG. 1A, the memory structure 100 may include first to fourth control gate connectors $118_1$-$118_4$ arranged over the first set of well regions $104_1$, $104_3$, $104_5$, $104_7$, respectively. The control gate connectors $118_1$-$118_4$ may each include an electrically conductive material, such as, but not limited to, aluminum, copper, tungsten, alloys thereof, or combinations thereof. Each of the control gate connectors $118_1$-$118_4$ may be electrically coupled with the additional conductive region within the respective well region $104_1$, $104_3$, $104_5$, $104_7$ over which the connector $118_1$-$118_4$ is arranged. For example, the first control gate connector $118_1$ may be arranged over and may be electrically coupled with the first additional conductive region $114_1$; whereas, the second control gate connector $118_2$ may be arranged over and may be electrically coupled with the second additional conductive region $114_2$. Each control gate connector $118_1$-$118_4$ may be configured to electrically couple the additional conductive region to an external voltage.

As shown in FIG. 1A, the memory structure 100 may also include a plurality of gate structures (including first to twelfth gate structures $120_1$, $120_2$, $120_3$, $120_4$, $120_5$, $120_6$, $120_7$, $120_8$, $120_9$, $120_{10}$, $120_{11}$, $120_{12}$) arranged over the substrate 102, for example, over the well regions $104_1$-$104_7$. For example, the first gate structure $120_1$ may be arranged over the second well region $104_2$ and may extend over the third well region $104_3$; whereas, the second gate structure $120_2$ may be arranged over the second well region $104_2$ and may extend over the first well region $104_1$. The first gate structure $120_1$ and the second gate structure $120_2$ may be arranged laterally adjacent to each other over the second well region $104_2$ in the second direction Y.

Referring to FIG. 1B, the first gate structure $120_1$ may be arranged laterally between the first conductive region $108_1$ and the second conductive region $108_2$ over the portion of the second well region $104_2$ between these regions $108_1$, $108_2$. The first gate structure $120_1$ may overlap vertically with each of the conductive regions $108_1$, $108_2$. Similarly, the second gate structure $120_2$ may be arranged laterally between the second conductive region $108_2$ and the third conductive region $108_3$ over the portion of the second well region $104_2$ between these regions $108_2$, $108_3$. The second gate structure $120_2$ may also overlap vertically with each of the conductive regions $108_2$, $108_3$.

Further, as shown in FIG. 1C, the first gate structure $120_1$ may extend over the third well region $104_3$, such that the second additional conductive region $114_2$ within the third well region $104_2$ may be arranged at least partially under the first gate structure $120_1$. Similarly, as shown in FIG. 1D, the second gate structure $120_2$ may extend over the first well region $104_1$, such that the first additional conductive region $114_1$ within the first well region $104_1$ may be arranged at least partially under the second gate structure $120_2$. In this document, by "a region arranged at least partially under a structure", it is meant that at least 1% of the area of the region's top surface may be arranged under the structure. In addition, the first gate structure $120_1$ may be arranged partially over the first isolation element $106_1$ and the second gate structure $120_2$ may be arranged partially over the second isolation element $106_2$. The first and second gate structures $120_1$, $120_2$ may be electrically isolated from the first and third well regions $104_1$, $104_3$ by the first and second isolation elements $106_1$, $106_2$, respectively.

As shown in FIGS. 1B-1D, each of the first and second gate structures $120_1$, $120_2$ may include a gate electrode $120_1a$, $120_2a$ and a gate dielectric layer $120_1b$, $120_2b$ under the gate electrode $120_1a$, $120_2a$. Each gate electrode $120_1a$, $120_2a$ may include gate electrode material, such as, but not limited to, polysilicon; whereas, each gate dielectric layer $120_1b$, $120_2b$ may include dielectric material, such as, but not limited to, oxide material for example, silicon oxide. Each of the third to twelfth gate structures $120_3$-$120_{12}$ may also include a gate electrode and a gate dielectric layer similar to that shown in FIGS. 1B-1D.

The memory structure 100 may further include a plurality of bit lines (BLs) 1202, 1204, 1206 connected to the bit line connectors $112_1$-$112_9$, and a plurality of control gate lines (CGLs) 1208, 1210, 1212, 1214 connected to the control gate connectors $118_1$-$118_4$. For example, as shown in FIG. 1A, the bit line connectors $112_1$, $112_4$, $112_7$/$112_2$, $112_5$, $112_8$/$112_3$, $112_6$, $112_9$ along a same row may be connected to a same BL 1202/1204/1206; whereas, each control gate connector $118_1$/$118_2$/$118_3$/$118_4$ may be connected to a respective CGL 1208/1210/1212/1214. Accordingly, the BLs 1202, 1204, 1206 may be electrically coupled to the well regions $104_2$, $104_4$, $104_6$ of the second conductivity type; whereas, the CGLs 1208, 1210, 1212, 1214 may be electrically coupled to the well regions $104_1$, $104_3$, $104_5$, $104_7$ of the first conductivity type. The BLs 1202, 1206 may be top BLs arranged over the substrate 102 and the BL 1204 may be a bottom BL arranged under the substrate 102. For clarity of illustration, the BLs 1202-1206 and CGLs 1208-1214 are not shown in FIGS. 1B-1D.

As shown in FIG. 1A, the memory structure 100 may be considered as including a plurality of memory devices/memory cells (for example, first, second, third, fourth, fifth and sixth memory devices/memory cells 100a, 100b, 100c, 100d, 100e, 100f), where each memory device 100a-100f may be a two transistors two capacitors (2T2C) memory device. Note that although the memory structure 100 is depicted in FIG. 1A as including six memory devices 100a-100f, it is understood that the memory structure 100 may include fewer (for example, one) or more memory devices, and the number of well regions $104_1$-$104_7$ and gate structures $120_1$-$120_{12}$ may vary accordingly.

The memory devices 100a-100f may be similar to one another and may be arranged laterally adjacent to one another in a matrix. Each memory device 100a-100f may include three well regions $104_1$-$104_3$/$104_3$-$104_5$/$104_5$-$104_7$ and two gate structures $120_1$,$120_2$/$120_3$,$120_4$/$120_5$,$120_6$/$120_7$,$120_8$/$120_9$,$120_{10}$/$120_{11}$,$120_{12}$. For example, as shown in FIG. 1A, a first memory device 100a may include the first, second and third well regions $104_1$, $104_2$, $104_3$ and the first and second gate structures $120_1$, $120_2$; and a second memory device 100b may include the third, fourth and fifth well regions $104_3$, $104_4$, $104_5$ and the third and fourth gate structures $120_3$, $120_4$. The arrangement of the third and fourth gate structures $120_3$, $120_4$ with respect to the well regions $104_3$, $104_4$, $104_5$ may be similar to that of the first and second gate structures $120_1$, $120_2$ with respect to the well regions $104_1$, $104_2$, $104_3$. For example, the third gate structure $120_3$ may be arranged over the fourth well region $104_4$ and may extend over the fifth well region $104_5$; whereas, the fourth gate structure $120_4$ may be arranged over the fourth well region $104_4$ and may extend over the third well region $104_3$. The arrangement of the third and fourth gate structures $120_3$, $120_4$ with respect to the isolation elements, conductive regions, additional conductive regions within the well regions $104_3$, $104_4$, $104_5$ may also be similar to that as described above for the first and second gate structures $120_1$, $120_2$.

As shown in FIG. 1A, adjacent memory devices 100a, 100b/100b, 100c in a same row may share a common well region $104_3$, $104_5$. For example, the first memory device 100a and the second memory device 100b in a same row may share the third well region $104_3$. The first gate structure $120_1$ (of the first memory device 100a) and the fourth gate structure $120_4$ (of the second memory device 100b) may be arranged laterally adjacent to each other over the third well region $104_3$ in the second direction Y. Further, adjacent memory devices 100a, 100d/100b, 100e/100c, 100f in a same column may share the same well regions $104_1$-$104_3$/$104_3$-$104_5$/$104_5$-$104_7$ and may also share one of the bit line connectors $112_2$, $112_5$, $112_8$ and the conductive region (e.g. $108_3$) under this bit line connector (e.g. $112_2$). For example, as shown in FIG. 1A, the first memory device 100a and a fourth memory device 100d in a same column may share the first, second and third well regions $104_1$, $104_2$, $104_3$, the bit line connector $112_2$ and the conductive region $108_3$. As shown in FIG. 1A, fifth and sixth gate structures $120_5$, $120_6$ (of the fourth memory device 100d) may be arranged over the second well region $104_2$, such that the first and second gate structures $120_1$, $120_2$ (of the first memory device 100a) and the fifth and sixth gate structures $120_5$, $120_6$ (of the fourth memory device 100d) may be arranged laterally adjacent to one another over the second well region $104_2$ in the second direction Y.

Each memory device 100a-100f of the memory structure 100 may be considered a two-bit/twin-bit device where the first bit (bit 1) may correspond to a state of one of its gate structures $120_1$-$120_{12}$ and the second bit (bit 2) may correspond to a state of the other of its gate structures $120_1$-$120_{12}$. For example, the first bit (bit 1) of the first memory device 100a may correspond to a state of the first gate structure $120_1$ and the second bit (bit 2) of the first memory device 100a may correspond to a state of the second gate structure $120_2$.

To perform an operation on a selected memory device 100a-100f, appropriate voltages may be applied to BLs 1202-1206 and CGLs 1208-1214 electrically coupled with the well regions $104_1$-$104_7$ of the memory device 100a-100f. For example, an operation may be performed on the first memory device 100a by applying appropriate voltages to the top BL 1202 and the bottom BL 1204 electrically coupled to the second well region $104_2$, the CGL 1208 electrically coupled to the first well region $104_1$ and the CGL 1210 electrically coupled to the third well region $104_3$. The CGL 1208 and the CGL 1210 may respectively be referred to as the first selected CGL (selected CGL1) and the second selected CGL (selected CGL2) for the memory device 100a; whereas, the BL 1202 may be referred to as the selected top BL for the memory device 100a. The remaining top BL 1206 and CGLs 1212, 1214 may be referred to as the unselected top BL and the unselected CGLs respectively.

Table 1 below shows the voltages that may be applied to the selected BL (e.g. 1202 for the first memory device 100a), the bottom BL 1204 and the selected CGLs (e.g. 1208, 1210 for the first memory device 100a) to perform various operations on the selected memory device (e.g. first memory device 100a) in a non-limiting embodiment.

TABLE 1

| | Selected CGL1 | Selected CGL2 | Unselected CGLs | Selected top BL | Bottom BL | Unselected top BL | SUB |
|---|---|---|---|---|---|---|---|
| PGM (bit 1) | 2.5-5 | 9 | 0 | 9 | 2-4 | 0 | 0 |
| PGM (bit 2) | 9 | 2.5-5 | 0 | 2-4 | 9 | 0 | 0 |
| ERS (BTB HHI) | 0 | 0 | 0 | 9 | 9 | 0 | 0 |
| Read | 2.5 | 2.5 | 0 | 1 | 0 | 0 | 0 |

As shown in Table 1, to program the first bit (PGM (bit 1)) of the first memory device 100a, a voltage ranging from 2.5V to 5V may be applied to the selected CGL1 1208, a voltage of 9V may be applied to the selected CGL2 1210, a voltage of 9V may be applied to the selected top BL 1202 connected to the first bit line connector $112_1$, and a voltage ranging from 2V to 4V may be applied to the bottom BL 1204 connected to the second bit line connector $112_2$. The unselected CGLs 1212, 1214 and BL 1206, and the SUB (substrate 102) may be grounded. Due to the voltage difference between the selected top BL 1202 and the bottom BL 1204, electrons may flow from the third conductive region $108_3$ under the second bit line connector $112_2$ to the second conductive region $108_2$, and may then be injected into the first gate structure $120_1$. This may thus program the first bit (bit 1) of the first memory device 100a.

To program the second bit (PGM (bit 2)) of the first memory device 100a, a voltage of 9V may be applied to the selected CGL1 1208, a voltage ranging from 2.5V to 5V may be applied to the selected CGL2 1210, a voltage ranging from 2V to 4V may be applied to the selected top BL 1202 and a voltage of 9V may be applied to the bottom BL 1204. The unselected CGLs 1212, 1214 and BL 1206, and the SUB (substrate 102) may be grounded. Due to the voltage difference between the selected top BL 1202 and the bottom BL 1204, electrons may flow from the first conductive region $108_1$ under the first bit line connector $112_1$ to the second conductive region $108_2$, and may then be injected into the second gate structure $120_2$. This may thus program the second bit (bit 2) of the first memory device 100a.

To erase the memory device 100a, a voltage of 9V may be applied to the selected top BL 1202 and the bottom BL 1204. The CGLs 1208, 1210, 1212, 1214, the unselected BL 1206, and the SUB (substrate 102) may be grounded. Due to the voltage differences between the BLs 1202, 1204 and the CGLs 1208, 1210, a first electrical field may be formed between the first and second well regions $104_1$, $104_2$ and a second electrical field may be formed between the second and third well regions $104_2$, $104_3$. These electrical fields may induce hot electron/hole pairs (forming a gate induced leakage current (GIDL). The hot holes may be injected into the first and second gate structures $120_1$, $120_2$, hence neutralizing the electrons in these gate structures $120_1$, $120_2$. Accordingly, the first and second bits may be erased.

To read the memory device 100a, a voltage of 2.5V may be applied to each of the selected CGL1 1208 and the selected CGL2 1210, and a voltage of 1V may be applied to the selected top BL 1202. The bottom BL 1204, the unselected CGLs 1212, 1214 and BL 1206, and the SUB (substrate 102) may be grounded. Due to the voltage difference between the selected top BL 1202 and the bottom BL 1204, current may flow through the memory device 100a between the first conductive region $108_1$ and the third conductive region $108_3$. The magnitude of this current may depend on the states of the first and second bits (or in other words, the states of the first and second gate structures $120_1$, $120_2$) of the memory device 100a. For example, if both the first and second bits are programmed (in other words, electrons are present in both the first and second gate structures $120_1$, $120_2$), the channel regions under the gate structures $120_1$, $120_2$ may be turned off and thus, no or minimal current (I1) may flow through the memory device 100a. On the other hand, if both the first and second bits are erased (in other words, electrons are absent in both the first and second gate structures $120_1$, $120_2$), the channel regions under the gate structures $120_1$, $120_2$ may be turned on and thus, a larger current (I2) may flow through the memory device 100a. If only one of the bits is programmed, the channel region under the gate structure with electrons may be turned off and the channel region under the other gate structure without electrons may be turned on. Hence, a current (I3) having a magnitude between that of I1 and I2 may flow through the memory device 100a. The magnitude of the current (I3) may differ based on which of the first and second bits is programmed.

Similar operations as described above may be performed on each of the other memory devices 100b-100f by applying appropriate voltages to the BLs 1202-1206 and CGLs 1208-1214. Note that in alternative non-limiting embodiments, the voltages applied to the BLs 1202-1206 and CGLs 1208-1214 to perform the various operations on the memory devices 100a-100f may differ from that shown in Table 1.

Figure 2:
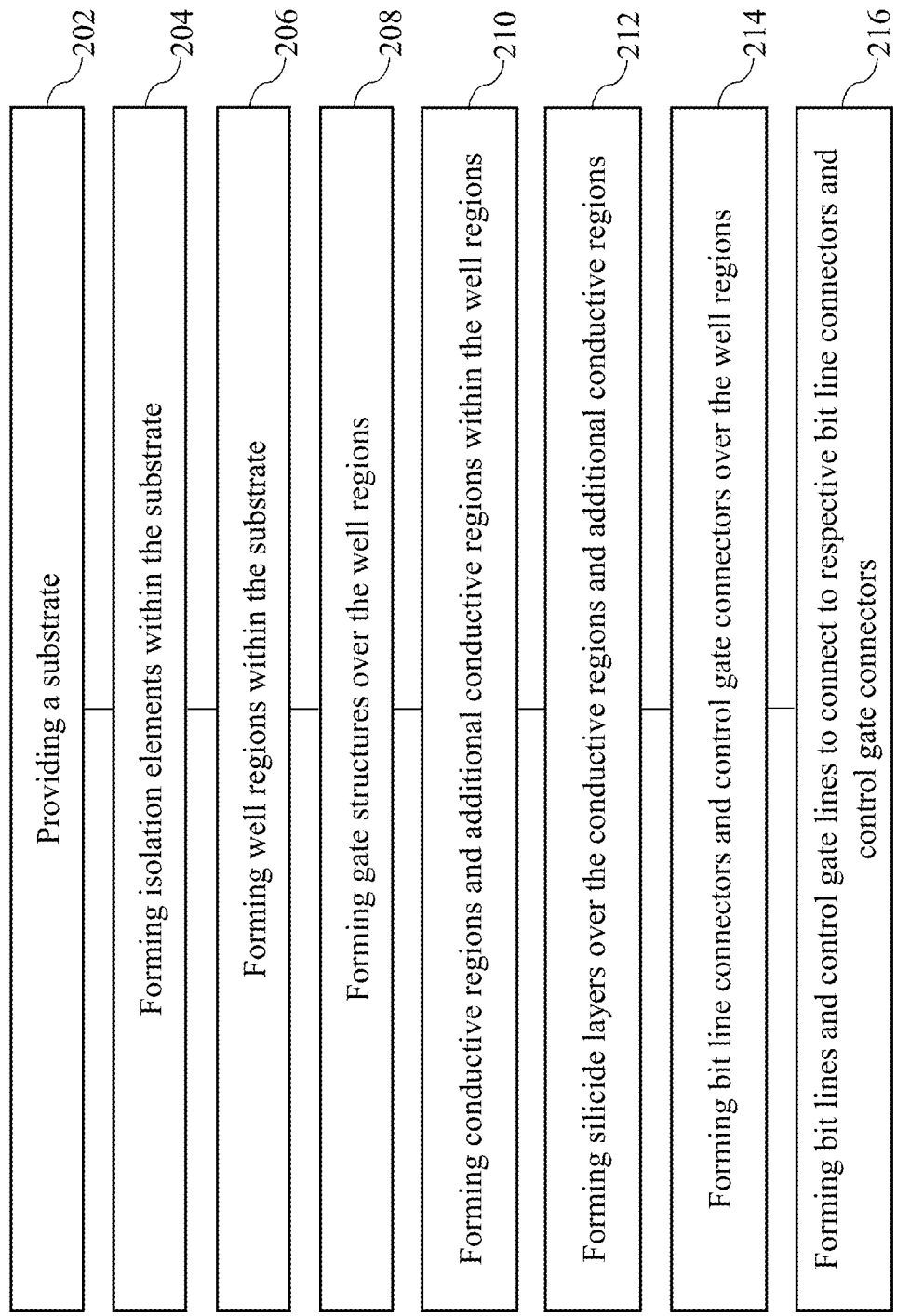
FIG. 2 shows a flow diagram illustrating a method of forming the memory structure of FIG. 1A.

FIG. 2 shows a flow diagram illustrating a method of forming the memory structure 100 according to various non-limiting embodiments.

At 202, the method may include providing the substrate 102.

At 204, the method may include forming the isolation elements (e.g. $106_1$, $106_2$) within the substrate 102. The isolation elements (e.g. $106_1$, $106_2$) may be formed by etching the substrate 102 to form openings and depositing isolation material into these openings.

At 206, the method may include forming the well regions $104_1$-$104_7$ within the substrate 102. The well regions $104_1$-$104_7$ may be formed by doping the substrate 102 at the regions between the isolation elements (e.g. $106_1$, $106_2$) with the appropriate dopants.

At 208, the method may include forming the gate structures $120_1$-$120_{12}$ over the well regions $104_1$-$104_7$ to form an intermediate structure. The gate structures $120_1$-$120_{12}$ may be formed by depositing oxide material over the substrate 102, depositing gate electrode material over the oxide material, and etching the oxide material and the gate electrode material.

At 210, the method may include forming the conductive regions (e.g. $108_1$-$108_3$) and the additional conductive regions (e.g. $114_1$, $114_2$) within the well regions $104_1$-$104_7$. These regions (e.g. $108_1$-$108_3$, $114_1$, $114_2$) may be formed by injecting dopants of the first conductivity type into the intermediate structure formed at 208. During this process, some of the dopants may be implanted into the gate structures $120_1$-$120_{12}$ and the remaining dopants may be implanted into the substrate 102 to form the conductive regions (e.g. $108_1$-$108_3$) and additional conductive regions (e.g. $114_1$, $114_2$). Accordingly, these regions (e.g. $108_1$-$108_3$, $114_1$, $114_2$) may only be present along exposed regions of the substrate 102 (in other words, regions not under the gate structures $120_1$-$120_{12}$). However, a small portion of each of the conductive regions (e.g. $108_1$-$108_3$) and additional conductive regions ($114_1$, $114_2$) may be arranged under a respective gate structure $120_1$-$120_{12}$ due to diffusion of the dopants within the substrate 102.

At 212, the method may include forming the silicide layers (e.g. $110_1$-$110_3$, $116_1$, $116_2$) over the conductive regions (e.g. $108_1$-$108_3$) and the additional conductive regions (e.g. $114_1$, $114_2$). These silicide layers (e.g. $110_1$-$110_3$, $116_1$, $116_2$) may be formed by implanting silicide material into the substrate 102.

At 214, the method may include forming the bit line connectors $112_1$-$112_9$ and the control gate connectors $118_1$-$118_4$ over the well regions $104_1$-$104_7$.

At 216, the method may include forming the bit lines 1202-1206 and the control gate lines 1208-1214 to connect to respective bit line connectors $112_1$-$112_9$ and control gate connectors $118_1$-$118_4$.

The above described order for the method is only intended to be illustrative, and the method is not limited to the above specifically described order unless otherwise specifically stated.

By arranging the gate structures $120_1$-$120_{12}$ over the well regions $104_1$-$104_7$ in the manner as described above, each gate structure $120_1$-$120_{12}$ may be used as a select transistor and a storage transistor for a memory device 100a-100f. Therefore, each memory device 100a-100f of the memory structure 100 may be a 2T2C memory device and may have a more compact cell size than a typical 2T2C memory device. For example, referring to FIG. 1A, a length L100 of each memory device 100a-100f may range from about 1 um to about 1.5 um and a width W100 of each memory device 100a-100f may range from about 1.5 um to about 2 um. In a non-limiting embodiment, the length L100 may be about 1.29 um and the width W100 may be about 1.57 um. Accordingly, the size of each memory device 100a-100f may be about 2.03 um$^2$. Since each memory device 100a-100f may be a twin-bit device, the 1 bit cell size of each memory device 100a-100f may be about 1.01 um$^2$.

Further, the sharing of the well regions $104_1$-$104_7$, bit line connectors $112_2$, $112_5$, $112_8$ and conductive regions (e.g. $108_3$) among multiple memory devices 100a-100f within the memory structure 100 may allow the memory structure 100 to include a greater number of memory devices 100a-100f. Therefore, the cell density of the memory structure 100 may be higher than typical memory structures including 2T2C memory devices.

In addition, by including a floating junction region (e.g. second conductive region $108_2$) in each memory device 100a-100f, the breakdown voltage (BVDSS) of each memory device 100a-100f with the drain to source shorted may be less sensitive to reduction in the length (Lg) of the gate structure $120_1$-$120_{12}$. Therefore, the lengths of the gate structures $120_1$-$120_{12}$ may be reduced to further reduce the size of the memory structure 100.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory structure comprising:
   a substrate;
   a first well region, a second well region, and a third well region arranged within the substrate, wherein the first well region and the third well region have a first conductivity type, and the second well region has a second conductivity type different from the first conductivity type, and wherein the second well region is arranged laterally between the first well region and the third well region, wherein the first well region, the second well region, and the third well region are arranged laterally adjacent to one another in a first direction;
   a first gate structure arranged over the second well region, wherein the first gate structure extends over the third well region;
   a second gate structure arranged over the second well region, wherein the second gate structure extends over the first well region, wherein the first gate structure and the second gate structure are arranged laterally adjacent to each other over the second well region in a second direction substantially perpendicular to the first direction; and
   a first conductive region, a second conductive region, and a third conductive region arranged laterally adjacent to one another in the second direction within the second well region, wherein the second conductive region is arranged between the first conductive region and the third conductive region, and
   wherein the first gate structure is arranged laterally between the first conductive region and the second conductive region, and wherein the second gate structure is arranged laterally between the second conductive region and the third conductive region.

2. The memory structure of claim 1, wherein the first conductive region, the second conductive region, and the third conductive region have the first conductivity type.

3. The memory structure of claim 1, wherein a doping concentration of each of the first conductive region, the second conductive region, and the third conductive region is higher than a doping concentration of the second well region.

4. The memory structure of claim 1, further comprising:
   a first connector arranged over and electrically coupled with the first conductive region; and
   a second connector arranged over and electrically coupled with the third conductive region.

5. The memory structure of claim 1, wherein the memory structure is a non-volatile memory structure.

6. The memory structure of claim 1, further comprising a first additional conductive region arranged within the first well region and at least partially under the second gate structure.

7. The memory structure of claim 6, wherein the first additional conductive region has the first conductivity type and a doping concentration of the first additional conductive region is higher than a doping concentration of the first well region.

8. The memory structure of claim 6, further comprising a second additional conductive region arranged within the third well region and at least partially under the first gate structure.

9. The memory structure of claim 1, further comprising:
   a first isolation element arranged between the first well region and the second well region; and
   a second isolation element arranged between the second well region and the third well region.

10. The memory structure of claim 9, wherein the first gate structure is arranged partially over the first isolation element.

11. The memory structure of claim 9, wherein the second gate structure is arranged partially over the second isolation element.

12. The memory structure of claim 1, further comprising:
   a fourth well region and a fifth well region arranged within the substrate, wherein the fifth well region has the first conductivity type, and the fourth well region has the second conductivity type, and wherein the fourth well region is arranged laterally between the third well region and the fifth well region;
   a third gate structure arranged over the fourth well region, wherein the third gate structure extends over the fifth well region; and
   a fourth gate structure arranged over the fourth well region, wherein the fourth gate structure extends over the third well region.

13. The memory structure of claim 12, wherein the first well region, the second well region, and the third well region are arranged laterally adjacent to one another in a first direction; and
   wherein the first gate structure and the fourth gate structure are arranged laterally adjacent to each other over the third well region in a second direction substantially perpendicular to the first direction.

14. The memory structure of claim 13, further comprising a fifth gate structure and a sixth gate structure arranged over the second well region, wherein the first gate structure, the second gate structure, the fifth gate structure and the sixth gate structure are arranged laterally adjacent to one another over the second well region in the second direction.

15. A method of forming a memory structure, the method comprising:
- providing a substrate;
- forming a first well region, a second well region and a third well region within the substrate, wherein the first well region and the third well region have a first conductivity type, and the second well region has a second conductivity type different from the first conductivity type, and wherein the second well region is arranged laterally between the first well region and the third well region, wherein the first well region, the second well region, and the third well region are arranged laterally adjacent to one another in a first direction;
- forming a first gate structure over the second well region, wherein the first gate structure extends over the third well region;
- forming a second gate structure over the second well region, wherein the second gate structure extends over the first well region, wherein the first gate structure and the second gate structure are arranged laterally adjacent to each other over the second well region in a second direction substantially perpendicular to the first direction; and
- forming a first conductive region, a second conductive region, and a third conductive region arranged laterally adjacent to one another in the second direction within the second well region, wherein the second conductive region is arranged between the first conductive region and the third conductive region, and
  wherein the first gate structure is arranged laterally between the first conductive region and the second conductive region and wherein the second gate structure is arranged laterally between the second conductive region and the third conductive region.

16. The method of claim 15,
- wherein the first conductive region, the second conductive region and the third conductive region have the first conductivity type; and
- wherein a doping concentration of each of the first conductive region, the second conductive region and the third conductive region is higher than a doping concentration of the second well region.

* * * * *